United States Patent
Murphy et al.

(10) Patent No.: US 9,008,601 B2
(45) Date of Patent: Apr. 14, 2015

(54) SINGLE DIFFERENTIAL-INDUCTOR VCO WITH IMPLICIT COMMON-MODE RESONANCE

(71) Applicant: Broadcom Corporation, Irvine, CA (US)

(72) Inventors: David Patrick Murphy, Costa Mesa, CA (US); Hooman Darabi, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 57 days.

(21) Appl. No.: 13/969,381

(22) Filed: Aug. 16, 2013

(65) Prior Publication Data

US 2015/0031313 A1 Jan. 29, 2015

Related U.S. Application Data

(60) Provisional application No. 61/859,073, filed on Jul. 26, 2013.

(51) Int. Cl.
*H04B 1/06* (2006.01)
*H03B 5/12* (2006.01)
*H04B 1/40* (2006.01)

(52) U.S. Cl.
CPC ............... *H03B 5/1228* (2013.01); *H04B 1/40* (2013.01)

(58) Field of Classification Search
CPC .......... H03B 1/00; H03B 5/00; H03B 5/1265; H03B 5/1228; H03J 2200/10; H03J 3/20; H04B 1/40

USPC ............... 455/76, 77, 180.3, 180.4, 208, 209, 455/236.1, 260, 261, 262, 264, 265, 315, 455/316; 331/74, 109, 167, 182, 183, 177 R, 331/117 FE

See application file for complete search history.

(56) References Cited

U.S. PATENT DOCUMENTS

| 6,268,777 | B1 * | 7/2001 | Welch ..................... 331/117 FE |
| 2007/0182502 | A1 * | 8/2007 | Shin et al. ..................... 331/167 |
| 2010/0277207 | A1 * | 11/2010 | Mahdavi ..................... 327/118 |

OTHER PUBLICATIONS

Hegazi, et al., "A Filtering Technique to Lower LC Oscillator Phase Noise", IEEE Journal of Solid-State Circuits, Dec. 2001, pp. 1921-1930, vol. 36, No. 12.

* cited by examiner

*Primary Examiner* — Tuan Pham
(74) *Attorney, Agent, or Firm* — McDermott Will & Emery LLP

(57) ABSTRACT

A circuit for a single differential-inductor oscillator with common-mode resonance may include a tank circuit formed by coupling a first inductor with a pair of first capacitors; a cross-coupled transistor pair coupled to the tank circuit; and one or more second capacitors coupled to the tank circuit and the cross-coupled transistors. The single differential-inductor oscillator may be configured such that a common mode (CM) resonance frequency ($F_{CM}$) associated with the single differential-inductor oscillator is at twice a differential resonance frequency ($F_D$) associated with the single differential-inductor oscillator.

20 Claims, 5 Drawing Sheets

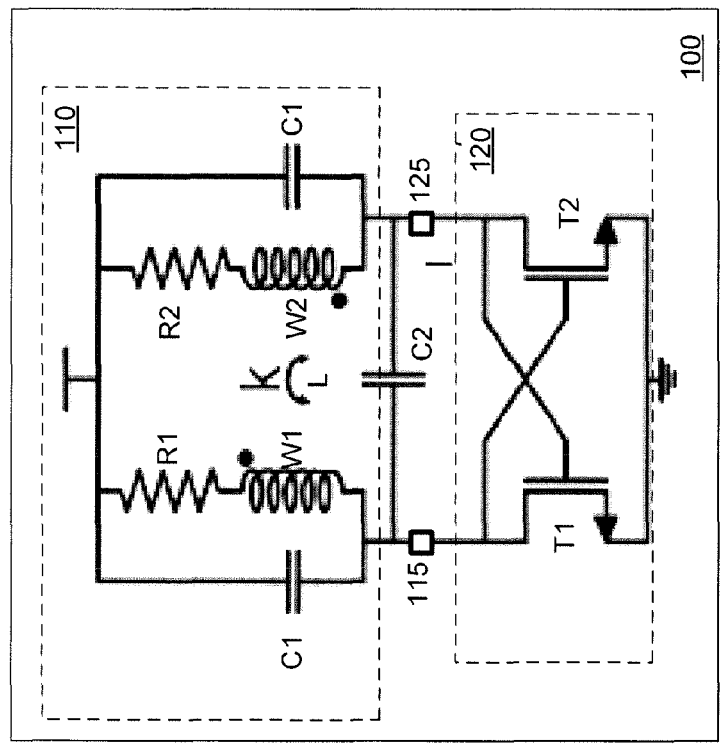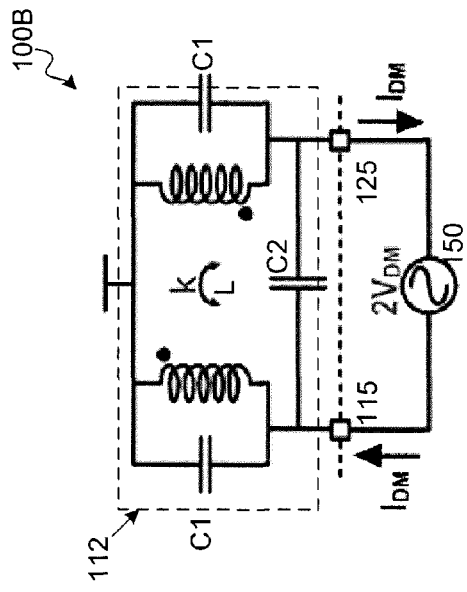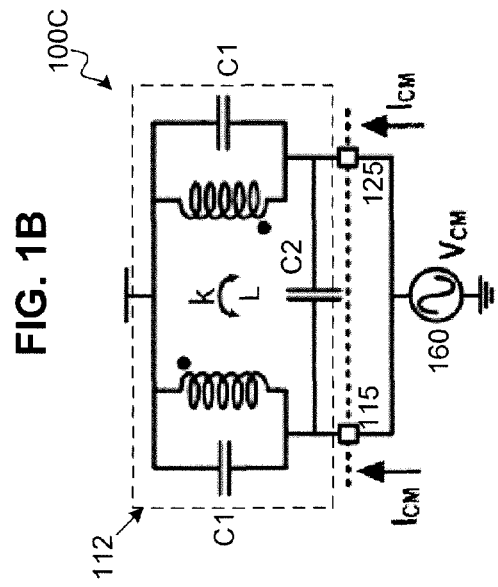
FIG. 1A
FIG. 1B
FIG. 1C

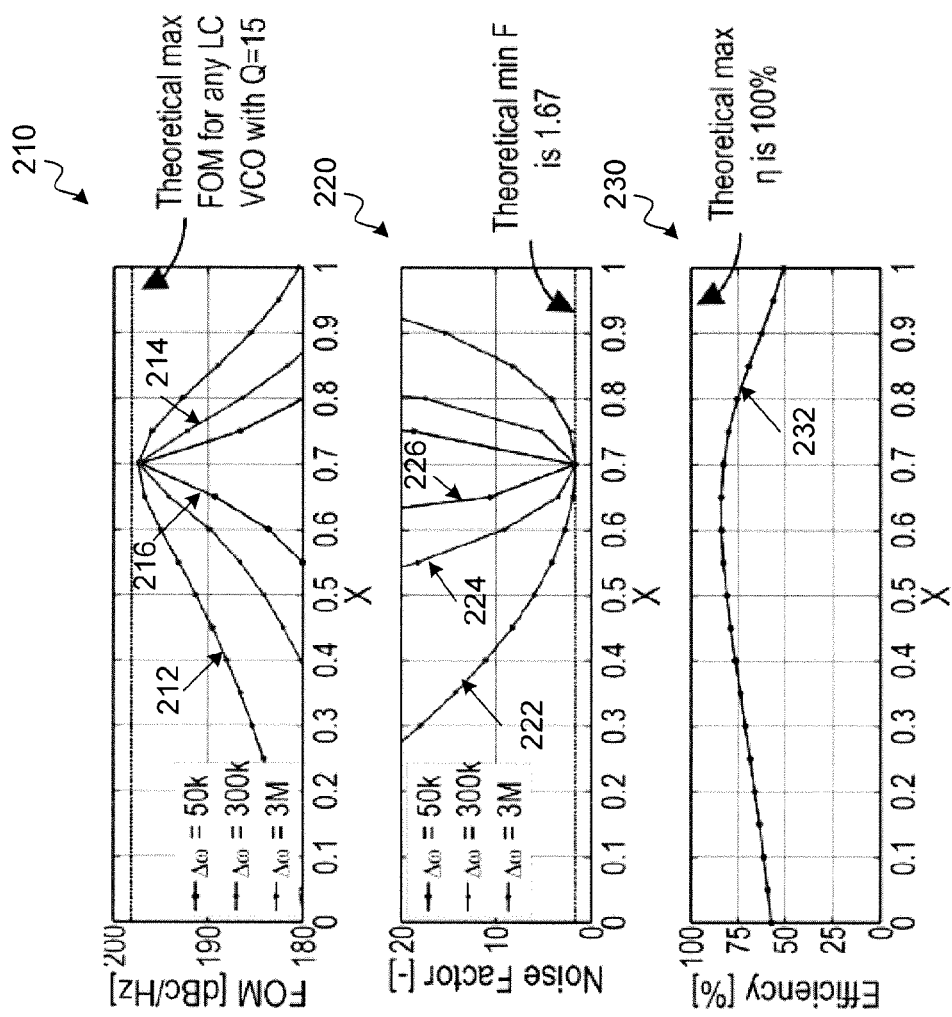
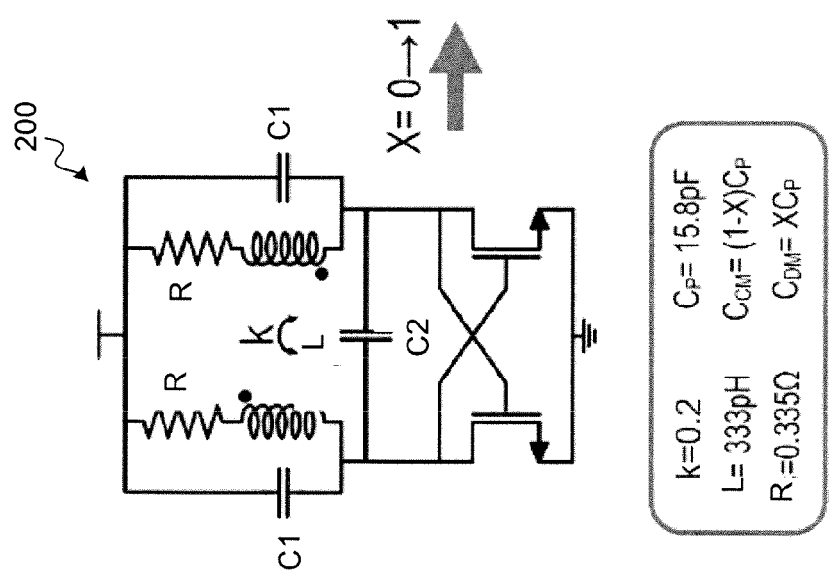
FIG. 2A
FIG. 2B

SINGLE DIFFERENTIAL-INDUCTOR VCO WITH IMPLICIT COMMON-MODE RESONANCE

CROSS-REFERENCE TO RELATED APPLICATIONS

This application claims the benefit of priority under 35 U.S.C. §119 from U.S. Provisional Patent Application 61/859,073 filed Jul. 26, 2013, which is incorporated herein by reference in its entirety.

TECHNICAL FIELD

The present description relates generally to communication systems, and more particularly, but not exclusively, to a single differential-inductor voltage-controlled oscillator (VCO) with implicit common-mode resonance.

BACKGROUND

Voltage controlled oscillators (VCOs) are the integral part of many communication systems, which use mixers to up-convert or down-convert signals. Mixers may up/down convert signals by employing local oscillators (LOs) to generate LO signals at a corresponding carrier frequency. Many LOs may use one or more oscillators (e.g., VCOs such as CMOS VCOs) to generate the LO signals. CMOS VCO performance metrics have not improved significantly over the last decade. An existing work that reported a VCO Figure of Merit (FOM) introduced a second resonant tank at a source of the differential pair, where the second resonant tank was tuned to twice the LO frequency ($F_{LO}$).

The additional tank circuit used in the existing work may provide a high common-mode impedance at the frequency of $2 \times F_{LO}$. The high common-mode impedance may prevent the differential pair transistors from conducting in the triode region and, so, can prevent the degradation of the oscillator's quality factor (Q). As a consequence the employed topology can achieve an oscillator noise factor (F) of close to 2, which is near the fundamental limit of a cross-coupled LC CMOS oscillator. A drawback of this solution is the additional area and the routing complexity demanded by an extra inductor of the additional tank circuit.

BRIEF DESCRIPTION OF THE DRAWINGS

Certain features of the subject technology are set forth in the appended claims. However, for purpose of explanation, several embodiments of the subject technology are set forth in the following figures.

FIGS. 1A-1C illustrate an example of a differential inductor oscillator with common mode (CM) resonance and examples of corresponding differential and CM excitation equivalent circuits of the same oscillator in accordance with one or more implementations.

FIGS. 2A-2B illustrate an example of differential inductor oscillator with CM resonance and corresponding phase noise and efficiency characteristics plots in accordance with one or more implementations.

DETAILED DESCRIPTION

Figures 3A, 3B, 3C:
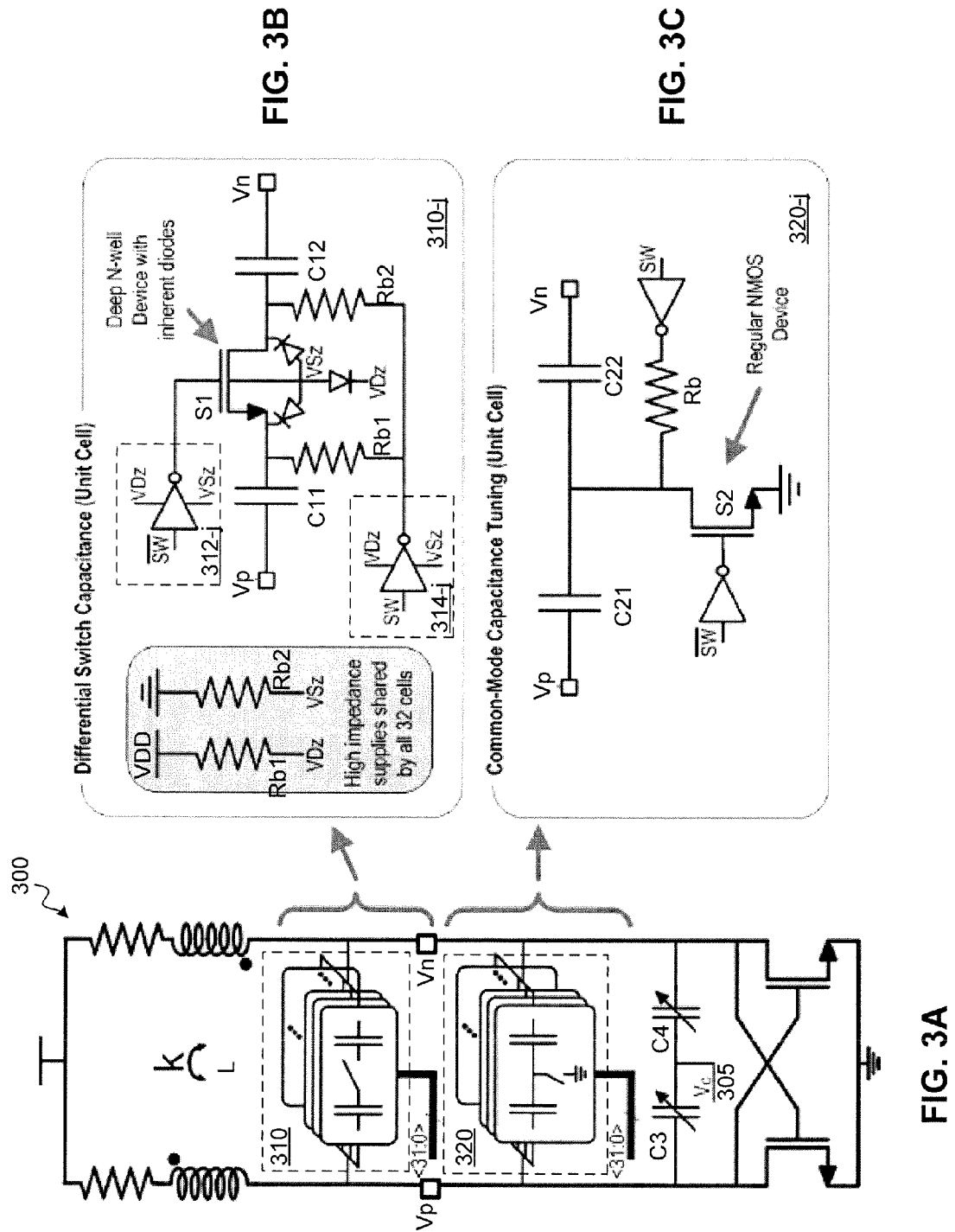
FIGS. 3A-3C illustrate examples of implementation of differential and CM capacitors of a differential inductor oscillator with CM resonance in accordance with one or more implementations.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more implementations. In one or more instances, well-known structures and components are shown in block diagram form in order to avoid obscuring the concepts of the subject technology.

The subject technology is directed to a differential inductor oscillator (e.g., a voltage-controlled oscillator (VCO)) with a common mode (CM) resonance at a CM frequency ($F_{DA}$) that can be tuned to be at twice the differential mode resonance frequency ($F_D$), which can result in a near ideal oscillator noise factor. By differential inductor, we refer to a 3-terminal network composed of two coupled inductors with an arbitrary coupling factor (k) between the coupled inductors. In the limiting case of k=0, the differential inductor is substantially the same as two isolated inductors. The disclosed single differential-inductor oscillator advantageously saves a second inductor that the existing solution had to use to minimize the phase noise. This can result in a substantial saving in chip area and cost, while keeping all positive features of the existing solution.

FIGS. 1A-1C illustrate an example of a single differential-inductor oscillator 100 with common mode (CM) resonance and examples of corresponding differential and CM excitation equivalent circuits 100B and 100C of the same oscillator in accordance with one or more implementations of the subject technology. The single differential-inductor oscillator (hereinafter "oscillator") 100 includes a tank circuit 110, and a cross-coupled transistor pair 120 coupled to one another at nodes 115 and 125, and a capacitor C2 (e.g., a variable capacitor) coupled between the nodes 115 and 125 to modify the tank circuit as described herein. The tank circuit 110 includes single differential inductor L that is a coupled inductor pair with coupling coefficient k formed by windings W1 and W2. The resistances R1 and R2 may represent losses associated with the windings W1 and W2. In one or more implementations, the coupled inductor pair may be realized as a spiral inductor having an inner loop that is smaller than an outer loop. The tank circuit 110 further includes capacitors C1 coupled in parallel with the single differential inductor L.

The cross coupled transistor pair 120 includes a pair of transistors (e.g., MOS transistors, such as NMOS transistors) T1 and T2. A gate node of the transistor T1 is coupled to a drain node of the transistor T2, and a gate node of the transistor T2 is coupled to a drain node of the transistor T1. The source node of the both transistors are coupled to ground potential and the drain nodes of the transistors T1 and T2 are coupled to nodes 115 and 125, respectively. The cross-coupled pair may function as an active portion of the oscillator 100 that provides a negative resistance, which nullifies the damping effect of the positive resistances R1 and R2 associated the winding W1 and W2 on the oscillation of the tank circuit 110. In one or more implementations, the source nodes of the transistors T1 and T2 may be coupled, instead of the ground potential, to a filtered current source to achieve a level of control of the output amplitude of the oscillator 100. The configuration shown in FIG. 1A, however, can maximize the output amplitude and a figure of merit (FOM) described herein.

The operation of the oscillator 100 without the capacitor C2 is known, and the capacitor C2 is added as a modification feature of the subject technology to facilitate achieving a desired relationship between the differential and CM resonance frequencies of the oscillator circuit 100. In one or more aspects, the capacitor C2 may be formed by a number of capacitor elements, the capacitances of which can be adjusted to tune the CM resonance frequency to be at twice the differential resonance frequency, as discussed in more detail herein. As an advantageous feature of the disclosed technique, the CM resonance frequency may be tuned independently of the differential resonance frequency, as shown in FIGS. 1B and 1C and described below.

In the differential excitation equivalent circuit 100B shown in FIG. 1B, the tank circuit 112 is similar to the tank circuit 110 of FIG. 1A as modified by the capacitor C2 and is coupled at nodes 115 and 125 to a differential voltage signal source 150. In the tank circuit 112, the resistors R1 and R2 of tank circuit 100 are not shown as they are supposed to be canceled out by the negative resistance introduced by the cross-coupled transistor pair 120 of FIG. 1A. The cross-coupled transistor pair 120 is replaced by an equivalent differential voltage (e.g., $2V_{DM}$) signal source 150 that drives differential currents $I_{DM}$ to the tank circuit 112. From the differential excitation equivalent circuit 100B, the differential resonance frequency ($F_D$) can be derived as:

$$F_D = 1/(2\pi\sqrt{L(1+k)(C_{CM}+C_{DM})}) \quad (1)$$

Where, $F_D$ is the same as the oscillation frequency of the single differential-inductor oscillator, L and k are the inductance and coupling coefficient of the single inductor of FIG. 1B, and the differential mode capacitance $C_{DM}$ is equal to 2×C2 and $C_{CM}$ is equal to C1.

In the CM excitation equivalent circuit 100C shown in FIG. 1C, the tank circuit 112 is the same as the tank circuit 112 of FIG. 1B. The cross-coupled transistor pair 120 of FIG. 1A, in the CM excitation equivalent circuit 100C, is replaced by an equivalent CM voltage (e.g., $V_{CM}$) signal source 160 that drives CM currents $I_{CM}$ to the tank circuit 112. From the CM excitation equivalent circuit 100B, the CM resonance frequency can be derived as:

$$F_{CM} = 1/(2\pi\sqrt{L(1-k)C_{CM}}) \quad (2)$$

Where, $F_{CM}$ denotes the CM resonance frequency, L and k are the inductance and coupling coefficient of the single differential inductor of FIG. 1C, and the CM mode capacitance $C_{CM}$ is equal to C1. By proper selection of parameters k, C1 and C2, the CM resonance frequency can be tuned to be at twice the $F_D$ ($F_{CM}=2F_D$). It is known that meeting this condition can optimize the phase noise of the single differential-inductor oscillator 100. The existing solution achieves this condition by using an additional tank circuit. The subject technology saves significantly on chip area and cost by eliminating the need for the additional tank circuit while achieving substantially similar noise factor.

FIGS. 2A-2B illustrate an example of single differential-inductor oscillator 200 with CM resonance and corresponding phase noise and efficiency characteristics plots 210, 220, and 230 in accordance with one or more implementations of the subject technology. The single differential-inductor oscillator (hereinafter "oscillator") 200 is the same as the oscillator 100A of FIG. 1A, except for the resistors R1 and R2 that are replaced with a resistor R. The tuning of the CM resonance frequency, as discussed above, may be performed by varying any of the parameters of the expressions (1) and (2) for the $F_D$ and $F_{CM}$, such as k, $C_{DM}$, and $C_{CM}$, where $C_{DM}$ and $C_{CM}$ are related to the capacitance values C1 and C2. In one or more embodiments, the values of the capacitances $C_{DM}$ and $C_{CM}$ may be expressed in terms of a variable X, for example, as $C_{DM}=XCp$ and $C_{CM}=(1-X)Cp$, where X can be varied to tune the CM resonance, and Cp is a constant capacitance value The plot 210 illustrates variation of an FOM of the oscillator in dBc/Hz versus the variable X for various values of a frequency offset Δω (e.g., 50 KHz, 300 KHz, and 3 MHz) from the oscillation frequency of the oscillator 200. The FOM may be characterized as the phase noise per unit power consumption of the oscillator, and can be more precisely defined as:

$$FOM = \frac{\left(\frac{\omega}{\Delta\omega}\right)^2}{L\{\Delta\omega\}P_{DC[mW]}} = \frac{2\eta Q^2}{kTF}10^{-3} \quad (3)$$

Where w and $P_{DC}$ are the oscillation frequency and the total power consumption of the oscillator 200, respectively, is the oscillator's power efficiency and Q quality factor of the tank circuit (e.g., 112 of FIG. 1B), and F is the noise factor. In other words, the FOM of the oscillator depends on three variables: quality factor Q, efficiency η, and noise factor F of the oscillator 200. The FOM of the oscillator is maximum at X~0.7, as shown, for curves 212, 214, and 216 corresponding to various values of the frequency offset Δω (e.g., 50 KHz, 300 KHz, and 3 MHz).

Curves 222, 224 and 226 of the plot 220 show the noise factor (F) versus the variable X for various values of a frequency offset do (e.g., 50 KHz, 300 KHz, and 3 MHz), and indicate that the noise factor is minimum at the same value of X~0.7 (this optimum value of X depends on k, and can vary between designs). In addition, the value of the minimum noise factor at X~0.7 is approximately equal to the theoretical minimum value (e.g., of 1.67). The plot 230 that shows the variation of efficiency η versus the variable X, in which a curve 232 passes through a maximum point, not far from the theoretical maximum value of 100% (e.g. approximately 80%), at an X value near 0.7. In other words, X=0.7 value can be used as an example value of X that can achieve the criterion of $F_{CM}=2F_D$ for optimizing the phase noise of the oscillator 200, as discussed above. In other embodiments, for different values of Cp, k, and L, other values of the variable X may achieve the criterion of $F_{CM}=2F_D$ for optimizing the phase noise of the oscillator.

FIGS. 3A-3C illustrate examples of implementation of differential and CM capacitors of an oscillator 300 with CM resonance in accordance with one or more implementations of the subject technology. The oscillator 300 is a wideband, practical realization of the topology shown in FIG. 2A. In the oscillator 300, the capacitor C2 of FIG. 2A (e.g., twice the differential capacitance $C_{DM}$) and the capacitor C1 of FIG. 2A (e.g., the CM capacitance $C_{CM}$) are replaced with a differential switch capacitance circuit 310 (e.g., a switch capacitor bank) and a CM capacitance tuning circuit 320 (e.g., a switch capacitor bank) coupled between nodes Vn and Vp of the oscillator 300. Capacitors C3 and C4 are fine tuning capacitances and the node 305 may be coupled to a VCO control voltage (Vc) that can be used to tune the oscillating frequency of the oscillator 300. The differential switch capacitance circuit 310 may be implemented using a number of differential switch capacitance unit cells 310-*j* (e.g., j can be between one and 32), as shown in FIG. 3B. The CM capacitance tuning circuit 320 may include multiple CM capacitance tuning unit cells 320-*j*, as shown in FIG. 3C.

The ratio of the capacitances $C_{DM}$ and $C_{CM}$ may be set by the coupling coefficient k of the inductor L, through the expression:

$$\frac{C_{DM}}{C_{CM}} = \frac{3-5k}{1+k} \quad (4)$$

Where a higher k value may require less differential capacitance $C_{DM}$, but may result in a reduced common-mode quality factor Q. For example, if k=0.6, only common-mode capacitance $C_{CM}$ may be required, but the common-mode quality factor Q of the inductor L may be at least four times smaller than the differential quality factor Q of the same inductor L. By contrast, choosing a low or negative k value may maintain a large common-mode quality factor Q, but may require a small amount of common-mode capacitance, which may be difficult to achieve in a practical design. In one or more implementations, an inductor L with k=0.2 can be used that may require $C_{DM}/C_{CM}$=1.67, which may be implemented by using, for example, a two-turn inductor. To keep the coupling coefficient k small, the radius of the inner turn may be reduced.

Returning to FIG. 3B, the differential switch capacitance unit cells 310-*j* may include capacitors C11 and C12 (e.g., with fixed capacitances), a switch S1 (e.g., an NMOS transistor), bias inverters 312-*j* and 314-*j*, and resistors Rb1 and Rb2. The bias inverters 312-*j* and 314-*j* can selectively bias the switch S1 of a differential switch capacitance unit cell by coupling nodes of the switch S to high impedance supply terminals VDZ (e.g., tied to a normal analog supply voltage VDD) and VSZ (e.g., tied to ground potential). The selections may be made through control signals SW and $\overline{SW}$. Unlike a typical differential switched capacitor bank, all switch S1 may be placed in a common deep n-well, where the isolated p-substrate and surrounding n-well may be tied to ground and VDD, respectively, using large resistors Rb1 and Rb2. The use of the high impedance supply terminals VDZ and VSZ may facilitate minimizing the common-mode capacitance of the switch S1 due to the bulk diodes and gate capacitance, which can be significant when the switch is in the OFF state. In some embodiments, the size of the resistors Rb1 and Rb2 can be chosen such that they are large enough to prevent the common-mode quality factor Q from being degraded, but sufficiently small to prevent these resistors from significantly contributing to the phase noise through frequency modulation effects. In some aspects, the resistors Rb1 and Rb2 may have the same resistance values.

The CM capacitance tuning unit cells 320-*j* includes capacitors C21 and C22, and a switch S2 (e.g., a an NMOS transistor) controlled by control signals SW and $\overline{SW}$, applied through inverters and a bias resistor Rb. When the switch S2 is turned OFF, the capacitors C21 and C22 appear differentially across the VCO tank (between nodes Vn and Vp), but when the switch S2 is turned ON, the capacitors C21 and C22 are shunted to the ground potential.

Figure 4:
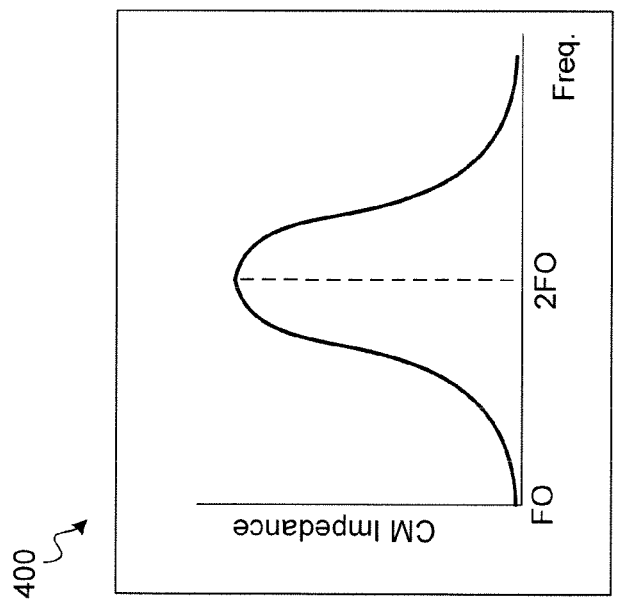
FIG. 4 illustrates an example of a plot of CM impedance versus frequency for a single differential-inductor oscillator with CM resonance in accordance with one or more implementations.

FIG. 4 illustrates an example of a plot 400 of the CM impedance versus frequency for a oscillator 300 of FIG. 3A in accordance with one or more implementations of the subject technology. The plot 400 shows that the CM impedance of the disclosed oscillator 300 is maximum at a frequency equal to twice the resonance frequency of the oscillator (e.g., FO). This is an advantageous feature of the subject technology over the existing solution that can achieve similar objectives without using an additional tank circuit.

Figure 5:
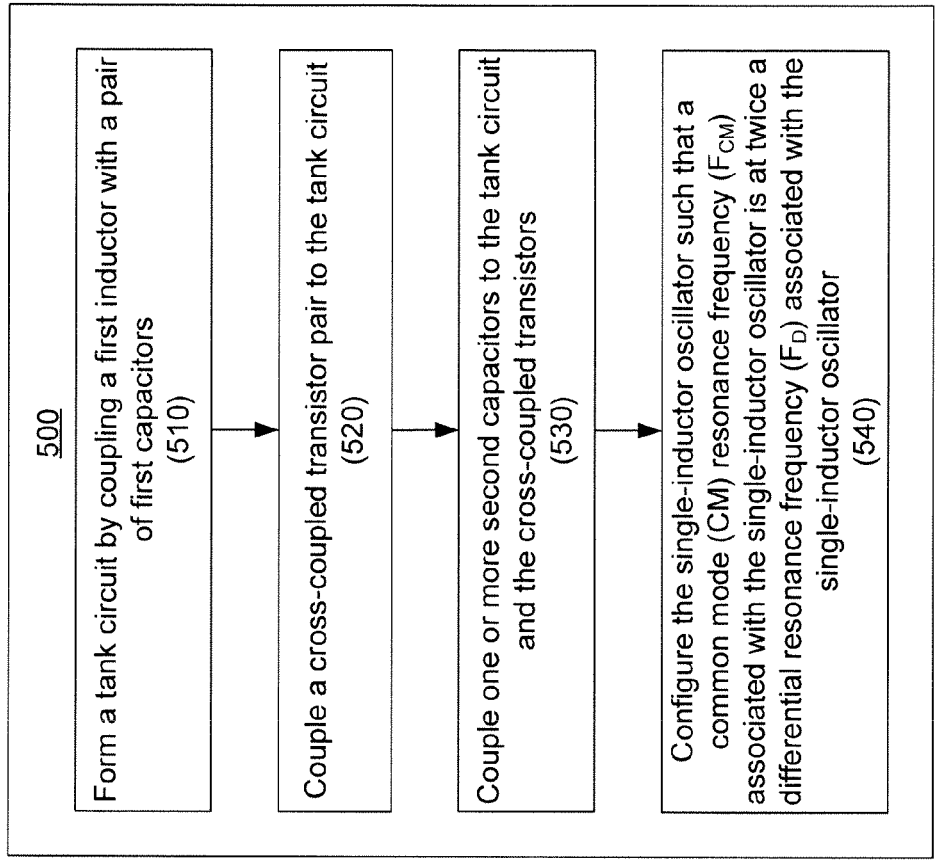
FIG. 5 illustrates an example of a method of providing a single differential-inductor oscillator with CM resonance in accordance with one or more implementations.

FIG. 5 illustrates an example of a method 500 of providing a single differential-inductor oscillator with CM resonance (e.g., 100 of FIG. 1A) in accordance with one or more implementations of the subject technology. The method 500 may include forming a tank circuit (e.g., 110 of FIG. 1A) by coupling a first inductor (e.g., L of FIG. 1A) with a pair of first capacitors (e.g., C1 of FIG. 1A) (510). A cross-coupled transistor pair (e.g., 120 of FIG. 1A) may be coupled to the tank circuit (520). One or more second capacitors (e.g., C2 of FIG. 1A) may be coupled to the tank circuit and the cross-coupled transistors (530). The single differential-inductor oscillator may be configured to allow tuning (e.g., by using 310 and 320 of FIG. 3A) of a common mode (CM) resonance frequency ($F_{CM}$) associated with the single differential-inductor oscillator to be at twice a differential resonance frequency ($F_D$) associated with the single differential-inductor oscillator (540).

Figure 6:
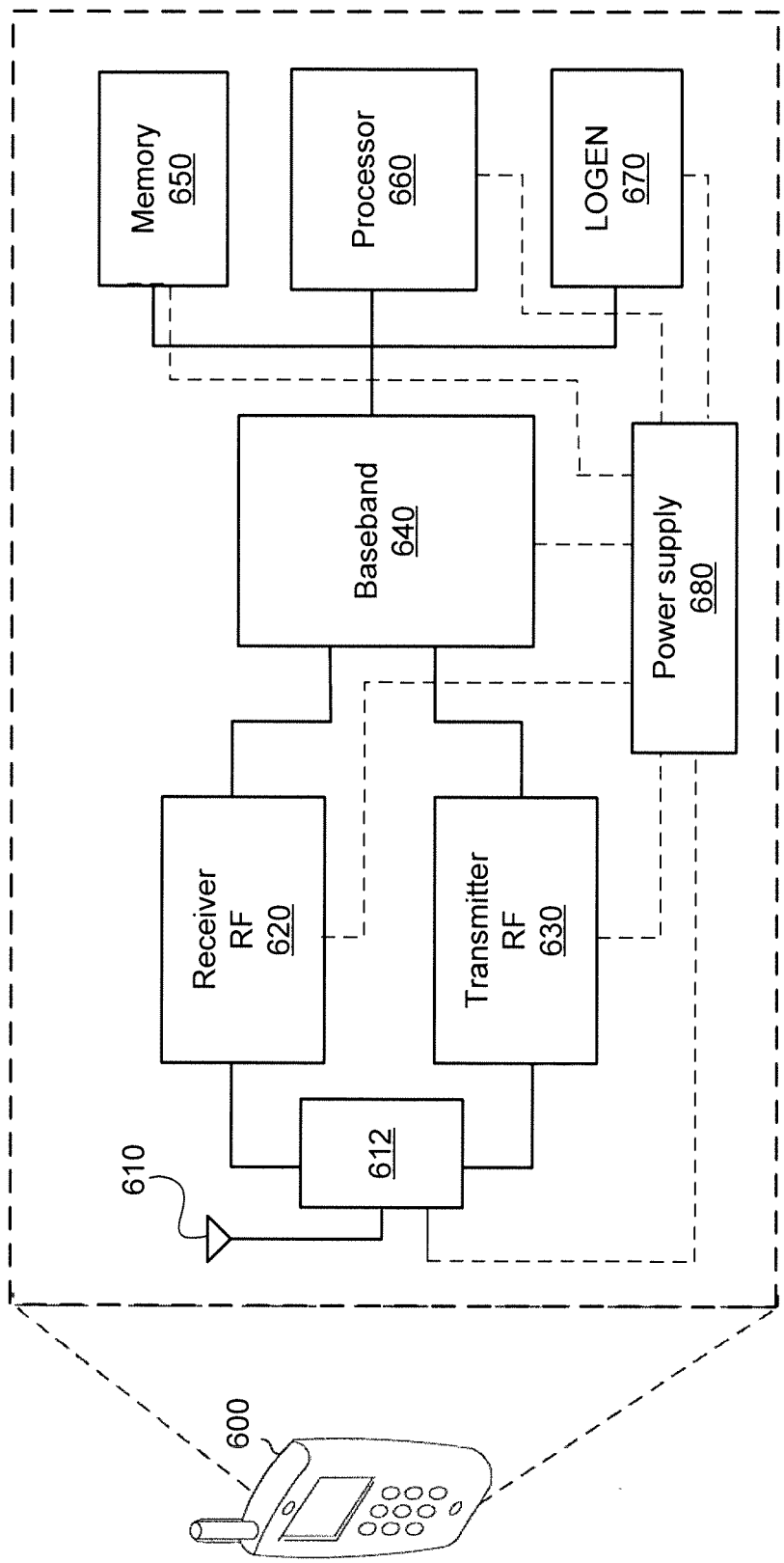
FIG. 6 illustrates an example wireless communication device in accordance with one or more implementations.

FIG. 6 illustrates an example wireless communication device 600 in accordance with one or more implementations of the subject technology. The wireless communication device 600 may comprise a radio-frequency (RF) antenna 610, a receiver 620, a transmitter 630, a baseband processing module 640, a memory 650, a processor 660, a local oscillator generator (LOGEN) 670, and a power supply 680. In various embodiments of the subject technology, one or more of the blocks represented in FIG. 6 may be integrated on one or more semiconductor substrates. For example, the blocks 620-670 may be realized in a single chip or a single system on chip, or may be realized in a multi-chip chipset.

The RF antenna 610 may be suitable for transmitting and/or receiving RF signals (e.g., wireless signals) over a wide range of frequencies. Although a single RF antenna 610 is illustrated, the subject technology is not so limited.

The receiver 620 may comprise suitable logic circuitry and/or code that may be operable to receive and process signals from the RF antenna 610. The receiver 620 may, for example, be operable to amplify and/or down-covert received wireless signals. In various embodiments of the subject technology, the receiver 620 may be operable to cancel noise in received signals and may be linear over a wide range of frequencies. In this manner, the receiver 620 may be suitable for receiving signals in accordance with a variety of wireless standards. Wi-Fi, WiMAX, Bluetooth, and various cellular standards. In various embodiments of the subject technology, the receiver 620 may not require any SAW filters and few or no off-chip discrete components such as large capacitors and inductors.

The transmitter 630 may comprise suitable logic circuitry and/or code that may be operable to process and transmit signals from the RF antenna 610. The transmitter 630 may, for example, be operable to up-covert baseband signals to RF signals and amplify RF signals. In various embodiments of the subject technology, the transmitter 630 may be operable to up-convert and amplify baseband signals processed in accordance with a variety of wireless standards. Examples of such standards may include Wi-Fi, WiMAX, Bluetooth, and various cellular standards. In various embodiments of the subject technology, the transmitter 630 may be operable to provide signals for further amplification by one or more power amplifiers.

The duplexer 612 may provide isolation in the transmit band to avoid saturation of the receiver 620 or damaging parts of the receiver 620, and to relax one or more design requirements of the receiver 620. Furthermore, the duplexer 612 may attenuate the noise in the receive band. The duplexer may be operable in multiple frequency bands of various wireless standards.

The baseband processing module 640 may comprise suitable logic, circuitry, interfaces, and/or code that may be operable to perform processing of baseband signals. The baseband processing module 640 may, for example, analyze received signals and generate control and/or feedback signals for configuring various components of the wireless communication device 600 such as the receiver 620. The baseband processing module 640 may be operable to encode, decode, transcode, modulate, demodulate, encrypt, decrypt, scramble, descramble, and/or otherwise process data in accordance with one or more wireless standards.

The processor 660 may comprise suitable logic, circuitry, and/or code that may enable processing data and/or controlling operations of the wireless communication device 600. In this regard, the processor 660 may be enabled to provide control signals to various other portions of the wireless communication device 600. The processor 660 may also control transfers of data between various portions of the wireless communication device 600. Additionally, the processor 660 may enable implementation of an operating system or otherwise execute code to manage operations of the wireless communication device 600.

The memory 650 may comprise suitable logic, circuitry, and/or code that may enable storage of various types of information such as received data, generated data, code, and/or configuration information. The memory 650 may comprise, for example, RAM, ROM, flash, and/or magnetic storage. In various embodiment of the subject technology, Information stored in the memory 650 may be utilized for configuring the receiver 620 and/or the baseband processing module 640.

The local oscillator generator (LOG EN) 670 may comprise suitable logic, circuitry, interfaces, and/or code that may be operable to generate one or more oscillating signals of one or more frequencies. The LOGEN 670 may be operable to generate digital and/or analog signals. In this manner, the LOGEN 670 may be operable to generate one or more clock signals and/or sinusoidal signals. Characteristics of the oscillating signals such as the frequency and duty cycle may be determined based on one or more control signals from, for example, the processor 660 and/or the baseband processing module 640. In one or more implementations, the LOGEN 670 may employ the high performance single differential-inductor oscillator (e.g., a VCO) with CM resonance of the subject technology (e.g., 100 of FIG. 1A) to generate the one or more clock signals and/or sinusoidal signals. The high performance of the disclosed single differential-inductor oscillator with CM resonance may be near the fundamental limit of LC CMOS VCO performance, limited only by quality factor Q of the tank circuit. An advantageous feature of the disclosed VCO is the implicit common-mode resonance at $2 \times F_{LO}$ that is accomplished without an additional inductor.

In operation, the processor 660 may configure the various components of the wireless communication device 600 based on a wireless standard according to which it is desired to receive signals. Wireless signals may be received via the RF antenna 610 and amplified and down-converted by the receiver 620. The baseband processing module 640 may perform noise estimation and/or noise cancellation, decoding, and/or demodulation of the baseband signals. In this manner, information in the received signal may be recovered and utilized appropriately. For example, the information may be audio and/or video to be presented to a user of the wireless communication device, data to be stored to the memory 650, and/or information affecting and/or enabling operation of the wireless communication device 600. The baseband processing module 640 may modulate, encode and perform other processing on audio, video, and/or control signals to be transmitted by the transmitter 630 in accordance to various wireless standards. The power supply 680 may provide one or more regulated rail voltages (e.g., $V_{DD}$) for various circuitries of the wireless communication device 600.

Those of skill in the art would appreciate that the various illustrative blocks, modules, elements, components, and methods described herein may be implemented as electronic hardware, computer software, or combinations of both. To illustrate this interchangeability of hardware and software, various illustrative blocks, modules, elements, components, and methods have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A circuit for a single differential-inductor oscillator with common-mode resonance, the circuit comprising:
    a tank circuit formed by coupling a first inductor with a pair of first capacitors;
    a cross-coupled transistor pair coupled to the tank circuit; and
    one or more second capacitors coupled to the tank circuit and the cross-coupled transistors,
    wherein the single differential-inductor oscillator is configured to allow tuning of a common mode (CM) resonance frequency ($F_{CM}$) associated with the single differential-inductor oscillator to be at twice a differential resonance frequency ($F_D$) associated with the single differential-inductor oscillator.

2. The circuit of claim 1, wherein the single differential-inductor oscillator comprises a voltage-controlled oscillator (VCO), and wherein the single differential-inductor oscillator is configured to allow tuning the $F_{CM}$ associated with the single differential-inductor oscillator to be at twice the $F_D$ associated with the single differential-inductor oscillator by adjusting a ratio of capacitance values of the first and second capacitors.

3. The circuit of claim 1, wherein the first inductor comprises a coupled inductor pair that is realized as a spiral inductor having an inner loop that is smaller than an outer loop.

4. The circuit of claim 1, wherein the first pair of capacitors is realized by a differential switch capacitance circuit comprising a plurality of differential switch capacitance unit cells.

5. The circuit of claim 4, wherein each of the plurality of differential switch capacitance unit cells is realized by two capacitors and a variable capacitance associated with a deep N-well device, having inherent junction diodes, that is biased by using high impedance supplies.

6. The circuit of claim 1, wherein the one or more second capacitors are realized by a CM capacitance tuning circuit comprising a plurality of CM capacitance tuning unit cells.

7. The circuit of claim 6, wherein each of the plurality of CM capacitance tuning unit cells is realized by two capacitors having a common node coupled through a switch to ground potential.

8. The circuit of claim 1, wherein the single differential-inductor oscillator is configured to allow tuning of the $F_{CM}$ associated with the single differential-inductor oscillator independent of the $F_D$ associated with the single differential-inductor oscillator.

9. The circuit of claim 1, wherein the single differential-inductor oscillator is configured to allow maximizing a value of a CM impedance at the $F_{CM}$ associated with the single differential-inductor oscillator.

10. The circuit of claim 1, wherein the single differential-inductor oscillator is configured to maximize values of phase noise per unit power for multiple frequency offsets at a point that corresponds to an optimum ratio of capacitance values of the first and second capacitors, wherein the multiple frequency offsets are measured from a resonance frequency of the single differential-inductor oscillator, and wherein the optimum ratio of capacitance values of the first and second capacitors corresponds to the $F_{CM}$ associated with the single differential-inductor oscillator being twice the $F_D$ associated with the single differential-inductor oscillator.

11. A method for providing a single differential-inductor oscillator with common-mode resonance, the method comprising:
    forming a tank circuit by coupling a first inductor with a pair of first capacitors;
    coupling a cross-coupled transistor pair to the tank circuit;
    coupling one or more second capacitors to the tank circuit and the cross-coupled transistors; and
    configuring the single differential-inductor oscillator to allow tuning of a common mode (CM) resonance frequency ($F_{CM}$) associated with the single differential-inductor oscillator to be at twice a differential resonance frequency ($F_D$) associated with the single differential-inductor oscillator.

12. The method of claim 11, wherein configuring the single differential-inductor oscillator comprises configuring a voltage-controlled oscillator (VCO), and wherein the method further comprises configuring the single differential-inductor oscillator to allow tuning of the $F_{CM}$ associated with the single differential-inductor oscillator to be at twice the $F_D$ associated with the single differential-inductor oscillator by adjusting a ratio of capacitance values of the first and second capacitors.

13. The method of claim 11, wherein forming a tank circuit is performed by coupling, with a pair of first capacitors, a coupled inductor pair that is realized as a spiral inductor having an inner loop that is smaller than an outer loop.

14. The method of claim 11, further comprising implementing the first pair of capacitors by a differential switch capacitance circuit comprising a plurality of differential switch capacitance unit cells.

15. The method of claim 14, further comprising implementing each of the plurality of differential switch capacitance unit cells by coupling two capacitors and a variable capacitance associated with a deep N-well device with inherent junction diodes, and biasing the deep N-well device by using high impedance supplies.

16. The method of claim 11, further comprising implementing the one or more second capacitors by a CM capacitance tuning circuit comprising a plurality of CM capacitance tuning unit cells, and realizing each of the plurality of CM capacitance tuning unit cells by two capacitors having a common node coupled through a switch to ground potential.

17. The method of claim 11, further comprising:
configuring the single differential-inductor oscillator to allow tuning of the $F_{CM}$ associated with the single differential-inductor oscillator independent of the $F_D$ associated with the single differential-inductor oscillator; and
configuring the single differential-inductor oscillator to maximize a value of a CM impedance at the $F_{CM}$ associated with the single differential-inductor oscillator.

18. The method of claim 11, further comprising configuring the single differential inductor to maximize values of phase noise per unit power for multiple frequency offsets at a point that corresponds to an optimum ratio of capacitance values of the first and second capacitors, wherein the multiple frequency offsets are measured from a resonance frequency of the single differential-inductor oscillator, and wherein the optimum ratio of capacitance values of the first and second capacitors corresponds to the $F_{CM}$ associated with the single differential-inductor oscillator being twice the $F_D$ associated with the single differential-inductor oscillator.

19. A communication device comprising:
a radio-frequency (RF) transceiver comprising one or more local oscillators;
the one or more local oscillators comprising one or more single differential-inductor voltage-controlled oscillators (VCOs) with common-mode resonances, wherein each single differential-inductor VCO comprises:
a tank circuit formed by coupling a first inductor with a pair of first capacitors;
a cross-coupled transistor pair coupled to the tank circuit; and
one or more second capacitors coupled to the tank circuit and the cross-coupled transistors,
wherein each single differential-inductor VCO is configured to allow tuning of a common mode (CM) resonance frequency ($F_{CM}$) associated with the single differential-inductor VCO to be at twice a differential resonance frequency ($F_D$) associated with the single differential-inductor VCO.

20. The communication device of claim 19, wherein the single differential-inductor VCO is configured to allow tuning of the $F_{CM}$ associated with the single differential-inductor VCO to be at twice the $F_D$ associated with the single differential-inductor VCO by adjusting a ratio of capacitance values of the first and second capacitors.

* * * * *